(12) United States Patent
Jeong et al.

(10) Patent No.: US 10,199,447 B2
(45) Date of Patent: Feb. 5, 2019

(54) DISPLAY DEVICE

(71) Applicant: LG Display Co., Ltd., Seoul (KR)

(72) Inventors: Ilgi Jeong, Cheongju-si (KR); Sungjoon Bae, Goyang-si (KR); Kyunghyun Cho, Jeongeup-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/815,147

(22) Filed: Nov. 16, 2017

(65) Prior Publication Data

US 2018/0151658 A1 May 31, 2018

(30) Foreign Application Priority Data

Nov. 30, 2016 (KR) .......................... 10-2016-0161516

(51) Int. Cl.
  *H01L 27/32* (2006.01)
  *G09G 3/325* (2016.01)
  *G09G 3/36* (2006.01)

(52) U.S. Cl.
  CPC ...... *H01L 27/3272* (2013.01); *H01L 27/3258* (2013.01); *H01L 27/3265* (2013.01); *H01L 27/3276* (2013.01); *G09G 3/325* (2013.01); *G09G 3/3659* (2013.01); *H01L 27/3227* (2013.01); *H01L 27/3262* (2013.01)

(58) Field of Classification Search
  CPC ............. H01L 27/3272; H01L 27/3258; H01L 27/3276; H01L 27/3265; H01L 27/3227; H01L 27/3262; G09G 3/3659; G09G 3/325
  See application file for complete search history.

(56) References Cited

U.S. PATENT DOCUMENTS

| | | |
|---|---|---|
| 9,147,723 B1 * | 9/2015 | Lee ...................... G09G 3/006 |
| 9,455,309 B2 | 9/2016 | Choi et al. |
| 9,786,728 B2 | 10/2017 | Choi et al. |
| 2015/0379923 A1 | 12/2015 | Lee et al. |
| 2016/0049454 A1 | 2/2016 | Park et al. |
| 2016/0188083 A1 | 6/2016 | Shi et al. |

FOREIGN PATENT DOCUMENTS

EP      2980853 A2      2/2016

OTHER PUBLICATIONS

Extended European Search Report, European Patent Office Patent Application No. 17202987.8, dated Apr. 24, 2018, 9 pages.

* cited by examiner

*Primary Examiner* — Karen Kusumakar
(74) *Attorney, Agent, or Firm* — Fenwick & West LLP

(57) ABSTRACT

A display device is disclosed. The display device includes a plurality of subpixels formed on a first substrate, each subpixel having an emission area, in which an emission element is disposed to emit light, and a circuit area, in which a circuit for driving the emission element is disposed, a sensing line disposed between the subpixels in a first direction, and a sensing connection line disposed in the circuit area in a second direction, that is transverse to the first direction, and made of an electrode layer positioned above the sensing line, the sensing connection line electrically connecting the subpixels to the sensing line.

15 Claims, 13 Drawing Sheets

DISPLAY DEVICE

CROSS-REFERENCE TO RELATED APPLICATIONS

This application claims the benefit of Republic of Korea Patent Application No. 10-2016-0161516, filed on Nov. 30, 2016, which is incorporated herein by reference in its entirety.

BACKGROUND

Field

The present disclosure relates to a display device.

Description of the Related Art

With the development of information technology, the market of display devices used as a connection medium between a user and information is growing. Thus, the use of display devices, such as an organic light emitting diode (OLED) display, a liquid crystal display (LCD), and a plasma display panel (PDP), is on the rise.

An OLED display includes a display panel including a plurality of subpixels and a driver for driving the display panel. The driver includes a scan driver for supplying a scan signal (or referred to as "gate signal") to the display panel, a data driver for supplying a data signal to the display panel, and the like.

When the scan signal and the data signal are supplied to the subpixels arranged in a matrix, the subpixels selected in response to the scan signal and the data signal emit light. Hence, the OLED display can display an image.

When the OLED display is used for a long time, the OLED display has a problem in that some of the components included in the subpixels experience a change in characteristics (for example, threshold voltage, current mobility, etc.). In order to compensate for the change in the characteristics, a method according to a related art has been proposed to add a sensing circuit for sensing characteristics of components included in subpixels.

When the sensing circuit is added inside the subpixel as described above, it is necessary to consider various problems including a reduction in an aperture ratio of the subpixel, a problem that lines such as signal lines or power lines and electrodes are damaged by a laser in a repair process, etc. Such problems may be of particular significance when high resolution and large-sized display devices are used.

SUMMARY

In one aspect, there is provided a display device comprising a plurality of subpixels formed on a first substrate, each subpixel having an emission area, in which an emission element is disposed to emit light, and a circuit area, in which a circuit for driving the emission element is disposed, a sensing line disposed between the subpixels in a first direction, and a sensing connection line disposed in the circuit area in a second direction, that is transverse to the first direction, and made of an electrode layer positioned above the sensing line, the sensing connection line electrically connecting the subpixels to the sensing line.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION

Figure 1:
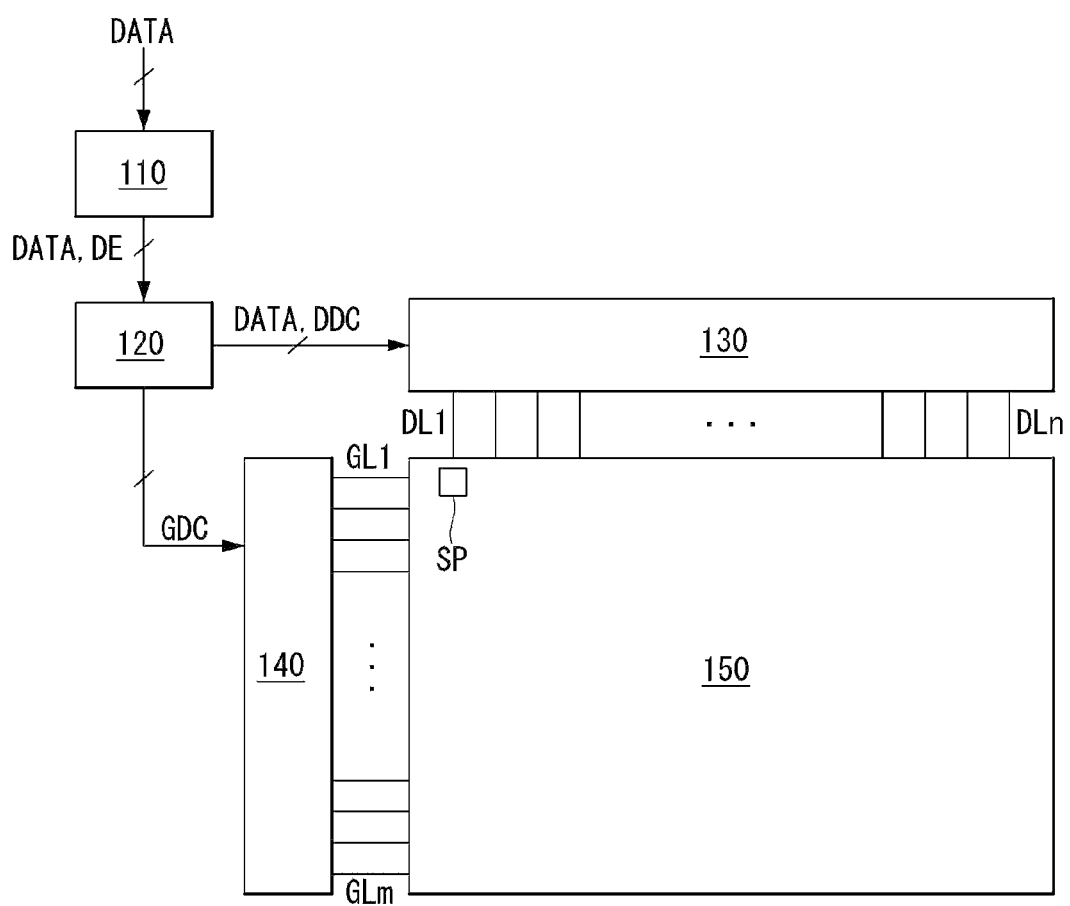
FIG. 1 is a schematic block diagram of an organic light emitting diode (OLED) display according to an embodiment of the disclosure.

Reference will now be made in detail to embodiments of the present disclosure, examples of which are illustrated in the accompanying drawings. Wherever convenient for explanation of the embodiments provided herein, the same reference numbers will be used throughout the drawings to refer to the same or like parts. In the present disclosure, a detailed description of known components or functionalities may be omitted if it is determined that a detailed description of such known components or functionalities may mislead or otherwise obscure the description of the embodiments of the present disclosure.

A display device according to embodiments may be implemented as a television system, a video player, a personal computer (PC), a home theater system, a smart phone, and the like. In the following description, a display device according to embodiments may be an organic light emitting diode (OLED) display implemented based on organic light emitting diodes (or light emitting elements), as an example. The OLED display according to embodiments performs an image display operation for displaying an image and an external compensation operation for compensating for changes in characteristics (or time-varying characteristics) of components over time.

The external compensation operation may be performed in a vertical blanking interval during the image display operation, in a power-on sequence interval before the beginning of the image display operation, or in a power-off sequence interval after the end of the image display operation. The vertical blanking interval is a period of time during which a data signal for image display is not applied, and is arranged between vertical active periods in which the data signal for one frame is applied.

The power-on sequence interval is a period of time between the turn-on of electric power for driving a display device and the beginning of an image display period, during which images are displayed on the display device. The power-off sequence interval is a period of time between the end of an image display period and the turn-off of electric power for driving the device.

An external compensation method performing the external compensation operation may operate a driving transistor in a source follower manner and then sense a voltage (for example, a source voltage of the driving transistor) stored in a line capacitor of a sensing line, but is not limited thereto. The line capacitor means a specific capacitance existing on the sensing line.

In order to compensate for a variation in a threshold voltage of the driving transistor, the external compensation method senses a source voltage when a voltage of a source node of the driving transistor is saturated (i.e., when a current Ids of the driving transistor is zero). Further, in order to compensate for a variation in mobility of the driving transistor, the external compensation method senses the voltage of the source node in a linear state before the voltage of the source node of the driving transistor is saturated.

In the following description, electrodes of a thin film transistor except a gate electrode may be referred to as a source electrode and a drain electrode, or a drain electrode and a source electrode, depending on types of thin film transistors. In addition, in the following description, a source electrode and a drain electrode, or a drain electrode and a source electrode, of the thin film transistor may be referred to as a first electrode and a second electrode.

Figure 2:
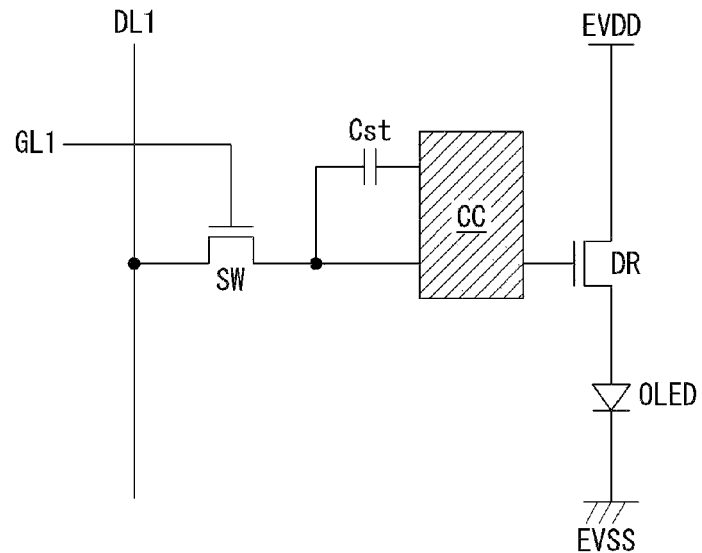
FIG. 2 schematically illustrates a circuit configuration of a subpixel according to an embodiment of the disclosure.
Figure 3:
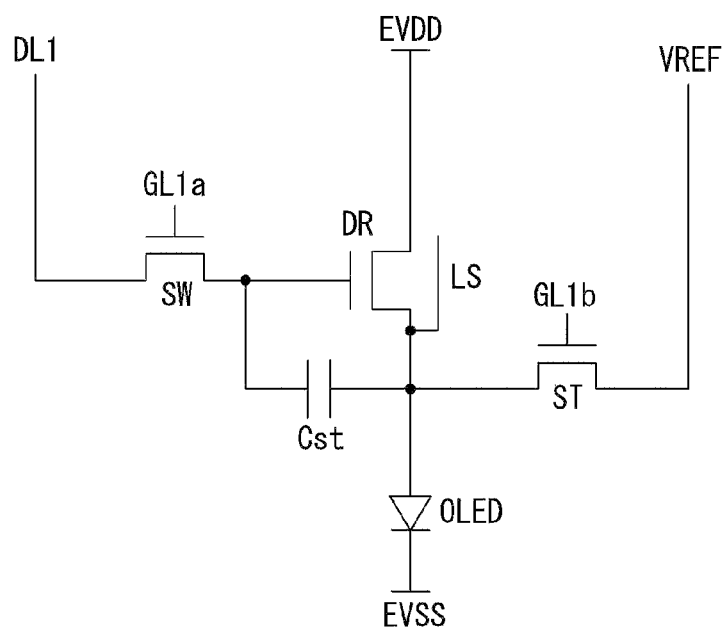
FIG. 3 illustrates in detail a circuit configuration of a subpixel according to an embodiment of the disclosure.
Figure 4:
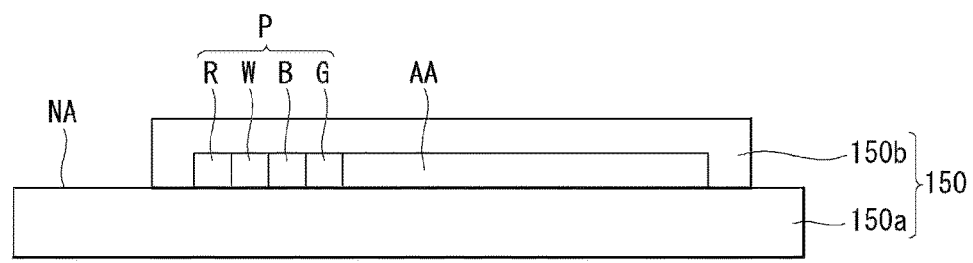
FIG. 4 is an exemplary cross-sectional view of a display panel according to an embodiment of the disclosure.
Figure 5:
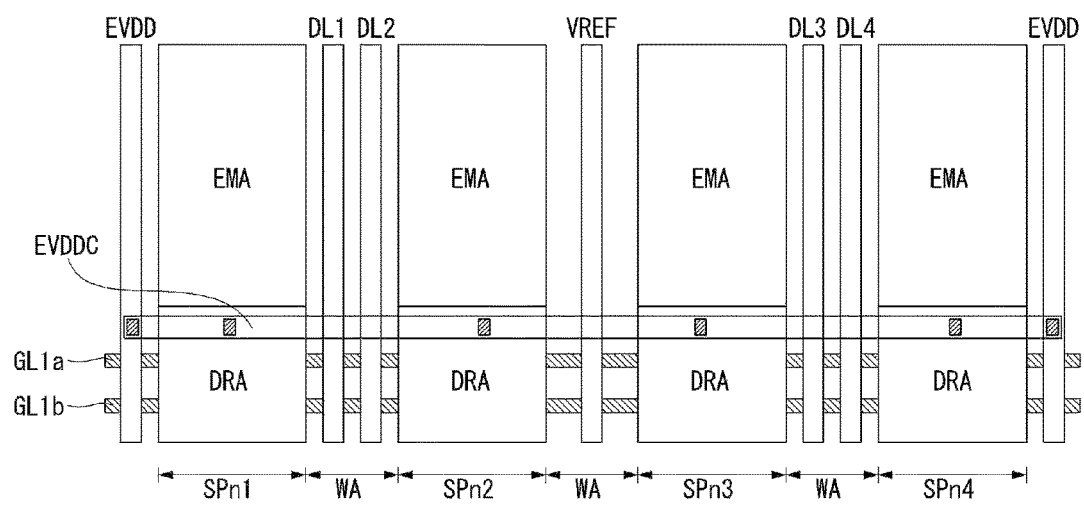
FIG. 5 schematically illustrates a planar layout of subpixels according to an embodiment of the disclosure.

FIG. 1 is a schematic block diagram of an OLED display. FIG. 2 schematically illustrates a circuit configuration of a subpixel. FIG. 3 illustrates in detail a circuit configuration of a subpixel. FIG. 4 is an exemplary cross-sectional view of a display panel. FIG. 5 schematically illustrates a planar layout of subpixels.

As shown in FIG. 1, an OLED display according to an embodiment includes an image processing unit 110, a timing controller 120, a data driver 130, a scan driver 140, and a display panel 150.

The image processing unit 110 outputs a data signal DATA and a data enable signal DE supplied from outside of the display device. The image processing unit 110 may further output one or more of a vertical sync signal, a horizontal sync signal, and a clock signal in addition to the data signal DATA and data enable signal DE. For the sake of brevity and ease of reading, these signals are not shown.

The timing controller 120 receives the data signal DATA and the data enable signal DE, and may further receive driving signals including the vertical sync signal, the horizontal sync signal, the clock signal, etc., from the image processing unit 110. The timing controller 120 outputs a gate timing control signal GDC for controlling operation timing of the scan driver 140 and a data timing control signal DDC for controlling operation timing of the data driver 130 based on the driving signals.

The data driver 130 samples and latches the data signal DATA received from the timing controller 120 in response to the data timing control signal DDC supplied from the timing controller 120 and converts the sampled and latched data signal DATA using gamma reference voltages. The data driver 130 outputs the converted data signal DATA to data lines DL1 to DLn. The data driver 130 may be formed as an integrated circuit (IC).

The scan driver 140 outputs a scan signal in response to the gate timing control signal GDC supplied from the timing controller 120. The scan driver 140 outputs the scan signal to scan lines GL1 to GLm. The scan driver 140 is formed as an IC or is formed on the display panel 150 in a gate-in-panel (GIP) manner.

The display panel 150 displays an image in response to the data signal DATA and the scan signal respectively received from the data driver 130 and the scan driver 140. The display panel 150 includes subpixels SP configured to display an image.

The subpixels SP may include red, green, and blue subpixels, or may include white, red, green, and blue subpixels. The subpixels SP may have one or more different emission areas depending on emission characteristics.

As shown in FIG. 2, each subpixel may include a switching transistor SW, a driving transistor DR, a capacitor Cst, a compensation circuit CC, and an organic light emitting diode OLED.

The switching transistor SW performs a switching operation so that a data signal supplied through a first data line DL1 is stored in the capacitor Cst as a data voltage in response to a scan signal supplied through a first scan line GL1. The driving transistor DR enables a driving current to flow between a first power line (or referred to as "high potential power line") EVDD and a second power line (or referred to as "low potential power line") EVSS based on the data voltage stored in the capacitor Cst. The organic light emitting diode OLED emits light depending on the driving current provided by the driving transistor DR.

The compensation circuit CC is a circuit that is added to the subpixel and compensates for a characteristic, such as a threshold voltage, etc., of the driving transistor DR. The compensation circuit CC includes one or more transistors. Configuration of the compensation circuit CC may be variously changed in accordance with various embodiments, depending on an external compensation method and is described below with reference to FIG. 3.

As shown in FIG. 3, the compensation circuit CC may include a sensing transistor ST and a sensing line (or referred to as "reference line") VREF. The sensing transistor ST is connected between the sensing line VREF and a node (hereinafter referred to as "sensing node") that is electrically coupled to a source electrode of the driving transistor DR and to an anode electrode of the organic light emitting diode OLED. The sensing transistor ST may supply an initialization voltage (or referred to as "sensing voltage") transmitted through the sensing line VREF to the sensing node of the driving transistor DR, or may sense a voltage or a current of the sensing node of the driving transistor DR or a voltage or a current of the sensing line VREF.

A first electrode of the switching transistor SW is connected to the first data line DL1, and a second electrode of the switching transistor SW is connected to a gate electrode of the driving transistor DR. A first electrode of the driving transistor DR is connected to the first power line EVDD, and a second electrode of the driving transistor DR is connected to the anode electrode of the organic light emitting diode OLED. A first electrode of the capacitor Cst is connected to the gate electrode of the driving transistor DR, and a second electrode of the capacitor Cst is connected to the anode electrode of the organic light emitting diode OLED. The anode electrode of the organic light emitting diode OLED is connected to the second electrode of the driving transistor DR, and a cathode electrode of the organic light emitting diode OLED is connected to the second power line EVSS. A first electrode of the sensing transistor ST is connected to the sensing line VREF, and a second first electrode of the sensing transistor ST is connected to the sensing node, i.e., the anode electrode of the organic light emitting diode OLED and the second electrode of the driving transistor DR.

An operation time of the sensing transistor ST may be similar to (or the same as) or different from an operation time of the switching transistor SW depending on an external compensation algorithm (or depending on a configuration of the compensation circuit). For example, a gate electrode of the switching transistor SW may be connected to a 1a scan line GL1a, and a gate electrode of the sensing transistor ST may be connected to a 1b scan line GL1b. In this instance, a scan signal (Scan) may be transmitted to the 1a scan line GL1a, and a sensing signal (Sense) may be transmitted to the 1b scan line GL1b. As another example, the gate electrode of the switching transistor SW and the gate electrode of the sensing transistor ST may share the 1a scan line GL1a or the 1b scan line GL1b and thus the gate electrodes of the switching transistor SW and the sensing transistor ST may be connected.

The sensing line VREF may be connected to the data driver, e.g., the data driver 130 shown in FIG. 1. In this instance, the data driver may sense the sensing node of the subpixel, via the sensing line VREF, during a non-display period of a real-time image or N frame period and generate a result of the sensing, where N is an integer equal to or greater than 1. The switching transistor SW and the sensing transistor ST may be turned on at the same time. In such a case, a sensing operation using the sensing line VREF and a data output operation, for driving the organic light-emitting diode OLED based on the data signal output by the data driver, are separated (or distinguished) from each other in accordance with a time-division driving method of the data driver.

In addition, a compensation target according to the sensing result may be a digital data signal, an analog data signal, a gamma signal, or the like. The compensation circuit for generating a compensation signal (or a compensation voltage) based on the sensing result may be implemented inside the data driver, inside the timing controller, or as a separate circuit.

A light shielding layer LS may be disposed only below a channel region of the driving transistor DR. Alternatively, the light shielding layer LS may be disposed below the channel region of the driving transistor DR and below channel regions of the switching transistor SW and the sensing transistor ST. The light shielding layer LS may be simply used for shielding external light. In addition, the light shielding layer LS may be connected to another electrode or another line and used as an electrode constituting the capacitor, etc. Therefore, the light shielding layer LS may be provided as a multilayer element formed of metal (for example, a multilayer of two different metals), so as to have a light shielding characteristic.

FIG. 3 illustrates the subpixel having a 3T(Transistor)1C (Capacitor) configuration, including the switching transistor SW, the driving transistor DR, the capacitor Cst, the organic light emitting diode OLED, and the sensing transistor ST, by way of example. However, when the compensation circuit CC is added to the subpixel, the subpixel may have various configurations such as 3T2C, 4T2C, 5T1C, and 6T2C.

As shown in FIG. 4, subpixels are formed on a display area AA of a first substrate (or referred to as "thin film transistor substrate") 150a, and each subpixel may have the circuit structure illustrated in FIG. 3. The subpixels on the display area AA are sealed by a protective film (or referred to as "protective substrate") 150b. In FIG. 4, the reference "NA" denotes a non-display area of the display panel 150.

The first substrate 150a may be formed of a rigid or semi-rigid material such as glass, or it may be formed of a flexible material.

The subpixels are arranged on a surface of the first substrate 150a, and may be horizontally or vertically arranged in order of red (R), white (W), blue (B), and green (G) subpixels on the display area AA, depending on an orientation of the first substrate 150a. The red (R), white (W), blue (B), and green (G) subpixels together form one pixel P. However, embodiments are not limited thereto. For example, the arrangement order of the subpixels may be variously changed depending on an emission material, an emission area, configuration (or structure) of the compensation circuit, and the like. Further, the red (R), blue (B), and green (G) subpixels may form one pixel P.

As shown in FIGS. 4 and 5, first to fourth subpixels SPn1 to SPn4 each having an emission area EMA and a circuit area DRA are formed on the display area AA of the first substrate 150a. An organic light emitting diode (or a light emitting element) is formed in the emission area EMA, and a circuit including a switching transistor, a sensing transistor, a driving transistor, etc., for driving the organic light emitting diode is formed in the circuit area DRA. The elements in the emission area EMA and the circuit area DRA are formed through a thin film deposition process and include a plurality of metal layers and a plurality of insulating layers.

In the first to fourth subpixels SPn1 to SPn4, the organic light emitting diode in the emission area EMA emits light according to an operation of the switching transistor and the driving transistor in the circuit area DRA. A line area WA is provided in areas adjacent to sides of each of the first to fourth subpixels SPn1 to SPn4. That is, the line area WA may be a composite area that includes all of the areas between respective subpixels. A first power line EVDD, a sensing line VREF, and first to fourth data lines DL1 to DL4 are disposed in the line area WA. The first power line EVDD is connected to all the first to fourth subpixels SPn1 to SPn4 through a first power connection line EVDDC.

For example, the first power line EVDD may be positioned on the left side of the first subpixel SPn1, the sensing line VREF may be positioned on the right side of the second subpixel SPn2, and the first and second data lines DL1 and DL2 may be positioned between the first subpixel SPn1 and the second subpixel SPn2. The sensing line VREF may be positioned on the left side of the third subpixel SPn3, the first power line EVDD may further be positioned on the right side of the fourth subpixel SPn4, and the third and fourth data lines DL3 and DL4 may be positioned between the third subpixel SPn3 and the fourth subpixel SPn4.

The first subpixel SPn1 may be electrically connected to the first power line EVDD on the left side of the first subpixel SPn1, the first data line DL1 on the right side of the first subpixel SPn1, and the sensing line VREF on the right side of the second subpixel SPn2. The second subpixel SPn2 may be electrically connected to the first power line EVDD on the left side of the first subpixel SPn1, the second data line DL2 on the left side of the second subpixel SPn2, and the sensing line VREF on the right side of the second subpixel SPn2.

The third subpixel SPn3 may be electrically connected to the sensing line VREF on the left side of the third subpixel SPn3, the third data line DL3 on the right side of third subpixel SPn3, and the first power line EVDD on the right side of the fourth subpixel SPn4. The fourth subpixel SPn4 may be electrically connected to the sensing line VREF on the left side of the third subpixel SPn3, the fourth data line DL4 on the left side of the fourth subpixel SPn4, and the first power line EVDD on the right side of the fourth subpixel SPn4.

The first to fourth subpixels SPn1 to SPn4 may be commonly connected to the sensing line VREF between the second subpixel SPn2 and the third subpixel SPn3. Namely, the first to fourth subpixels SPn1 to SPn4 may share the sensing line VREF with one another. However, embodiments are not limited thereto.

The lines such as the first power line EVDD and the sensing line VREF and electrodes constituting a thin film transistor are positioned on different layers, but are electrically connected to each other through contact holes (or via holes). The contact holes are formed through a dry or wet etching process to partially expose the electrode, the signal line, or the power line positioned on a lower part of the subpixel.

A method of manufacturing the display panel 150 may include deposition processes for depositing a conductive layer, a metal layer, an insulating layer, etc. on a substrate to form a structure including a variety of elements (including electrodes), power lines, signal lines, etc., and may further include a repair process for repairing one or more defects of the structure on the substrate or for turning off a defective subpixel.

Because the method of manufacturing the display panel is complicated as described above, an aperture ratio of the subpixel may be reduced when a sensing circuit for sensing characteristics of the components included in the subpixel is added, as adding such a circuit results in increasing a circuit area of the subpixel. Further, the power lines, the signal lines, and the electrodes may be damaged by a laser in the repair process.

Hereinafter, problems of an experimental example are discussed, and embodiments of the disclosure that overcome the problems are described. In the following description, embodiments of the disclosure are described using two scan lines as an example, but are not limited thereto.

Experimental Example

Figure 6:
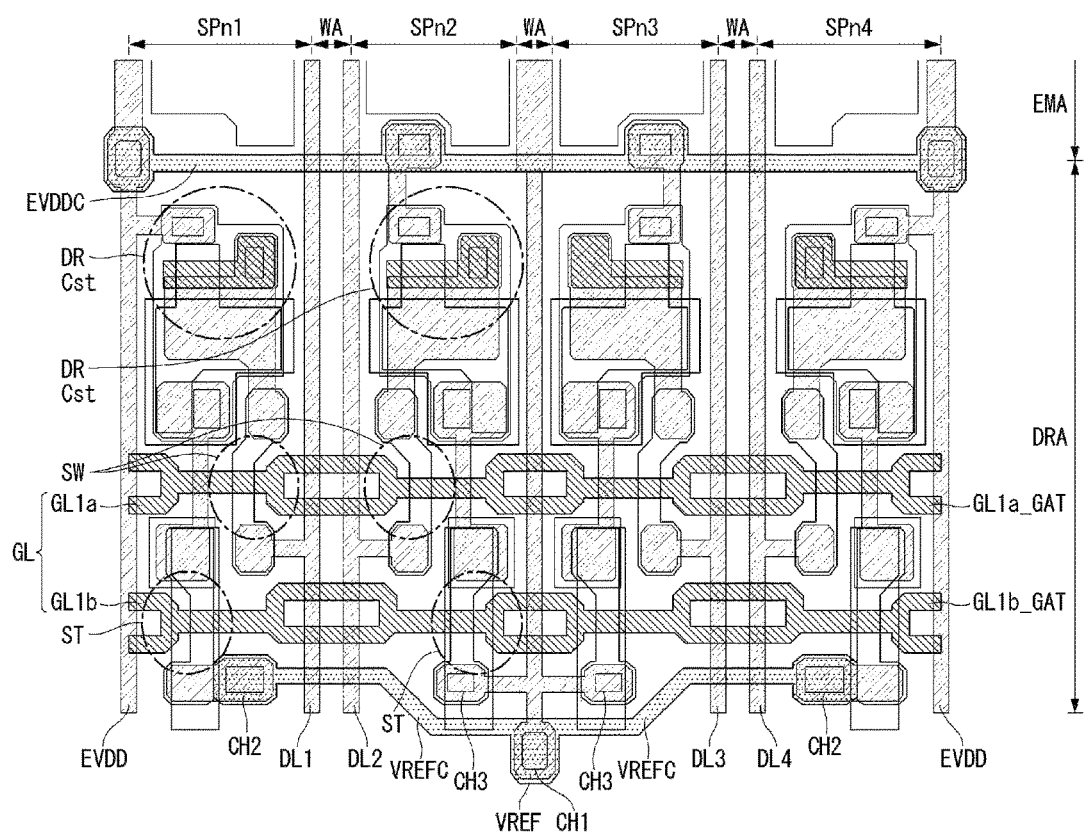
FIG. 6 illustrates in detail a circuit area of FIG. 5 in accordance with an experimental example according to an embodiment of the disclosure.

FIG. 6 illustrates in detail a circuit area of FIG. 5 in accordance with an experimental example.

As shown in FIG. 6, a driving transistor DR and a capacitor Cst are disposed in an upper portion of a circuit area DRA. The upper portion of the circuit area DRA is a portion adjacent to a first power connection line EVDDC connected to a first power line EVDD. The first power line EVDD is disposed in a first direction (for example, a vertical direction), and the first power connection line EVDCC is disposed in a second direction (for example, a horizontal direction) that is transverse to the first direction. A 1b scan line GL1b and a sensing transistor ST are disposed in a lower portion of the circuit area DRA. The lower portion of the circuit area DRA is a portion adjacent to a sensing connection line VREFC connected to a sensing line VREF. The sensing line VREF is disposed in the first direction, and the sensing connection line VREFC is disposed in the second direction. A 1a scan line GL1a and a switching transistor SW are disposed in a middle portion of the circuit area DRA, which is between the upper portion and the lower portion. The middle portion of the circuit area DRA is a portion adjacent to the 1a scan line GL1a disposed in the second direction.

The 1a scan line GL1a and the 1b scan line GL1b are formed of a gate metal layer between a light shielding layer and a source drain metal layer. The 1a scan line GL1a and the 1b scan line GL1b are spaced apart from each other. A portion of each of the 1a scan line GL1a and the 1b scan line GL1b that overlap (or intersect) the first power line EVDD and first to fourth data lines DL1 to DL4 is branched to form at least two lines (or branch portions) in consideration of an increase problem of a line load, a damage problem in a repair process, etc.

The sensing line VREF is disposed between a second subpixel SPn2 and a third subpixel SPn3. The sensing line VREF is disposed in the first direction (or a long axis direction of the subpixels). The sensing line VREF is formed of a source drain metal layer constituting source and drain electrodes of transistors SW, DR, and ST. An arrangement of the switching transistor SW, the driving transistors DR, the sensing transistors ST, and the capacitor Cst is not limited to FIG. 6.

The sensing connection line VREFC is disposed in the circuit area DRA and is connected to the sensing line VREF through a first contact hole CH1. The sensing connection line VREFC is disposed in the second direction (or a short axis direction of the subpixels). The sensing connection line VREFC is formed of a light shielding layer present in a lowermost layer of a first substrate.

Because the second subpixel SPn2 and the third subpixel SPn3 are adjacent to the sensing line VREF, they are directly connected to the sensing line VREF through third contact holes CH3. The second subpixel SPn2 and the third subpixel SPn3 are electrically connected to the sensing line VREF through the third contact holes CH3 formed in left and right protrusions of the sensing line VREF. On the other hand, because a first subpixel SPn1 and a fourth subpixel SPn4 are spaced apart from the sensing line VREF, they are connected to the sensing line VREF through second contact holes CH2 and the sensing connection line VREFC.

The experimental example forms the sensing connection line VREFC using the light shielding layer present in the lowermost layer. The light shielding layer may be selected as a multilayer (Mo/Ti/Cu) having a stack structure of molybdenum (Mo), titanium (Ti), and copper (Cu). Because the light shielding layer has the above-described structure, an overlap area between the sensing connection line VREFC and other electrodes or other lines has to be minimized in consideration of the repair process (or in consideration of the ease of the repair process). This is because when the overlap area increases, a short circuit between the sensing connection line VREFC and other electrodes or other lines may be generated in the repair process.

Accordingly, in the experimental example, the protrusions of the sensing line VREF and the third contact holes CH3 formed in the protrusions have to be disposed below the 1b scan line GL1b. Further, the first contact hole CH1 connecting the sensing line VREF to the sensing connection line VREFC has to be disposed below the protrusions of the sensing line VREF and the third contact holes CH3.

In the experimental example, because the sensing connection line VREFC, the scan lines GL1a and GL1b, and the sensing line VREF are respectively formed based on the light shielding layer, the gate metal layer, and the source drain metal layer, a short circuit related to all the three kinds of lines has to be considered. Thus, the experimental example has a difficulty in securing an aperture ratio of the subpixels when considering the repair process.

First Embodiment

Figure 7:
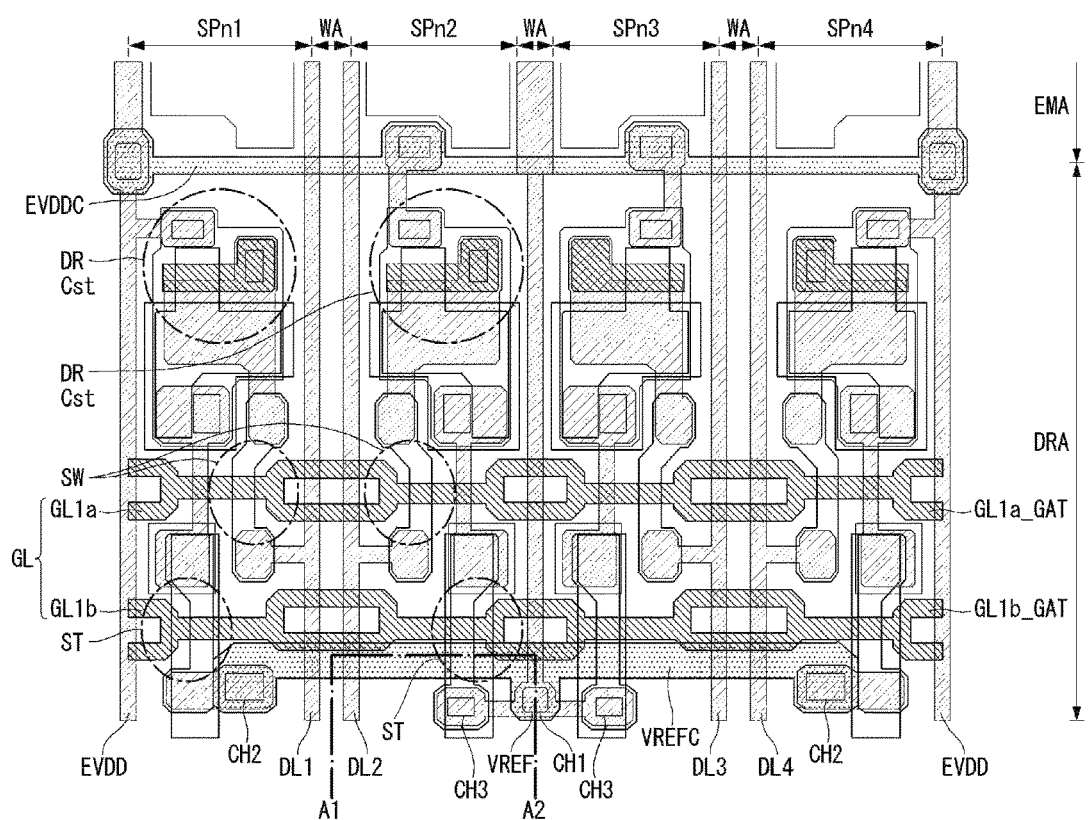
FIG. 7 illustrates in detail a circuit area of FIG. 5 in accordance with a first embodiment of the disclosure according to an embodiment of the disclosure.

FIG. 7 illustrates in detail a circuit area of FIG. 5 in accordance with a first embodiment of the disclosure. FIG.

Figure 9:
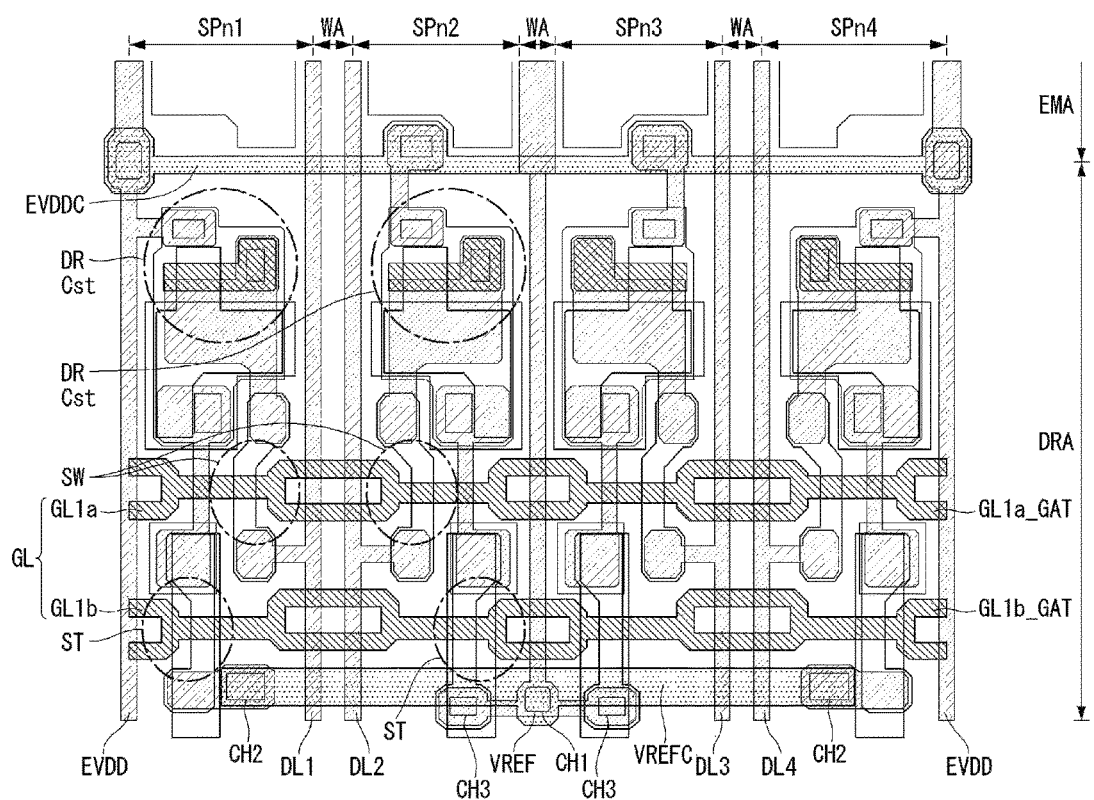
FIGS. 9 to 11 illustrate modification examples of the first embodiment of the disclosure according to an embodiment of the disclosure.
Figure 10:
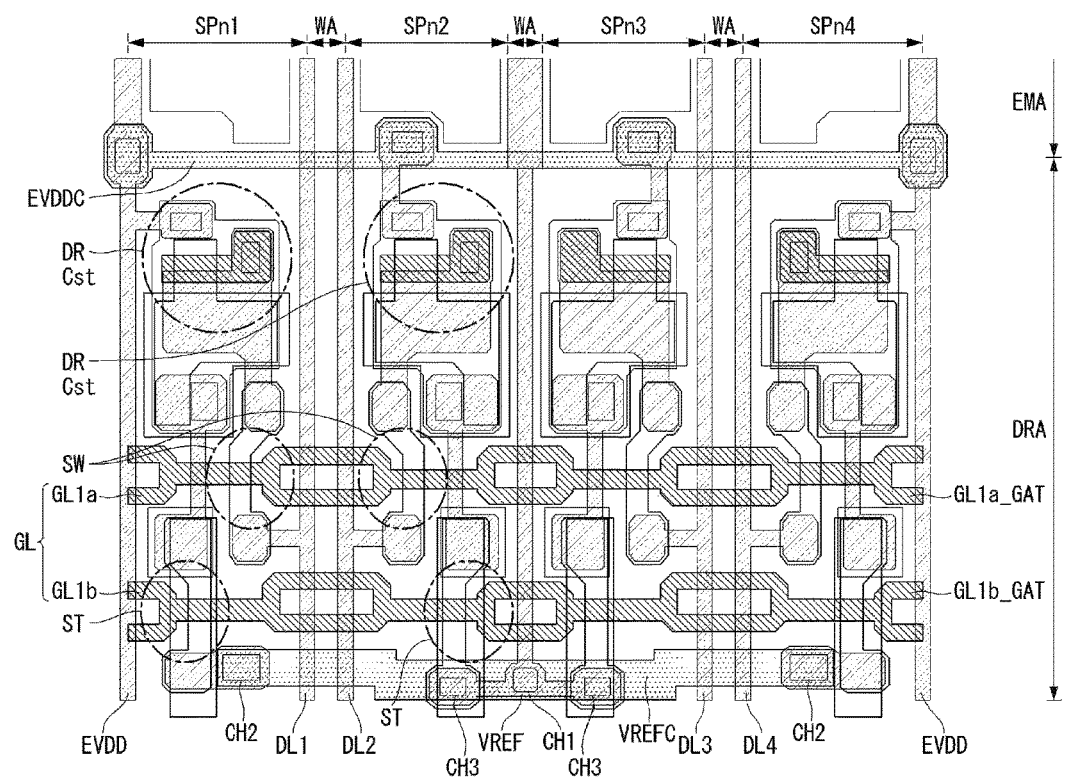
Figure 11:
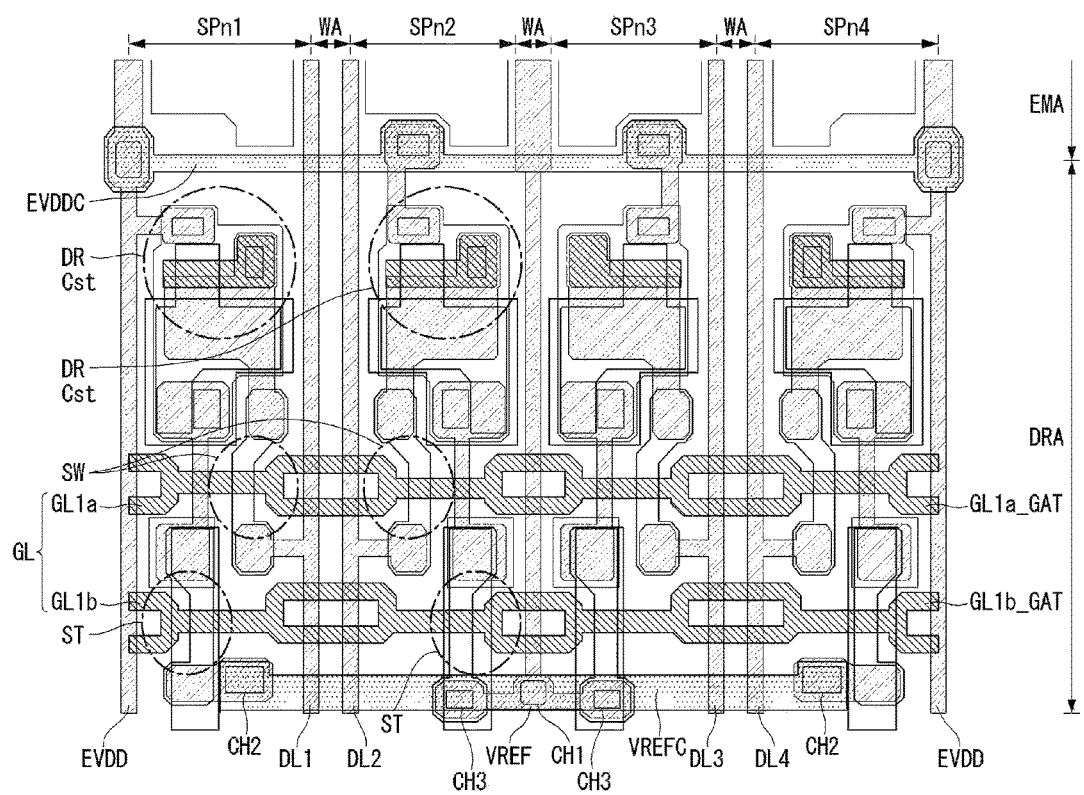

8 is a cross-sectional view of a portion A1-A2 of FIG. 7. FIGS. 9 to 11 illustrate modification examples of the first embodiment of the disclosure.

As shown in FIG. 7, a driving transistor DR and a capacitor Cst are disposed in an upper portion of a circuit area DRA. The upper portion of the circuit area DRA is a portion adjacent to a first power connection line EVDDC connected to a first power line EVDD. The first power line EVDD is disposed in a first direction (for example, a vertical direction), and the first power connection line EVDCC is disposed in a second direction (for example, a horizontal direction) that is transverse to the first direction. A 1$b$ scan line GL1$b$ and a sensing transistor ST are disposed in a lower portion of the circuit area DRA. The lower portion of the circuit area DRA is a portion adjacent to a sensing connection line VREFC connected to a sensing line VREF. The sensing line VREF is disposed in the first direction, and the sensing connection line VREFC is disposed in the second direction. A 1$a$ scan line GL1$a$ and a switching transistor SW are disposed in a middle portion of the circuit area DRA, which is between the upper portion and the lower portion. The middle portion of the circuit area DRA is a portion adjacent to the 1$a$ scan line GL1$a$ disposed in the second direction.

The sensing line VREF is disposed between a second subpixel SPn2 and a third subpixel SPn3. The sensing line VREF is disposed in the first direction (or a long axis direction of the subpixels). The sensing line VREF is formed of a source drain metal layer constituting source and drain electrodes of transistors SW, DR, and ST. An arrangement of the switching transistor SW, the driving transistors DR, the sensing transistors ST, and the capacitor Cst is not limited to FIG. 7.

The sensing connection line VREFC is disposed in the circuit area DRA and is connected to the sensing line VREF through a first contact hole CH1. The sensing connection line VREFC is disposed in the second direction (or a short axis direction of the subpixels). The sensing connection line VREFC is formed of a first electrode layer present in an upper side of a first substrate 150$a$ (see FIG. 8). The first electrode layer is used to form a first electrode (or referred to as "anode electrode") of an organic light emitting diode. An organic light emitting layer is disposed on the first electrode layer, and a second electrode (or referred to as "cathode electrode") formed of a second electrode layer is disposed on the organic light emitting layer.

Because the second subpixel SPn2 and the third subpixel SPn3 are adjacent to the sensing line VREF, they are directly connected to the sensing line VREF through third contact holes CH3. The second subpixel SPn2 and the third subpixel SPn3 are electrically connected to the sensing line VREF through the third contact holes CH3 formed in left and right protrusions of the sensing line VREF. On the other hand, because a first subpixel SPn1 and a fourth subpixel SPn4 are spaced apart from the sensing line VREF, they are connected to the sensing line VREF through second contact holes CH2 and the sensing connection line VREFC.

The sensing connection line VREFC includes one first vertical portion, one first horizontal portion, and two second vertical portions and has a shape similar to alphabet "E" rotated 90 degrees clockwise. The first vertical portion of the sensing connection line VREFC is connected to the first contact hole CH1 and is disposed in the vertical direction so that an end of the first vertical portion is positioned above the first contact hole CH1 on the plane. The first vertical portion of the sensing connection line VREFC is electrically connected to the sensing line VREF through the first contact hole CH1, and at the same time has an area overlapping the sensing line VREF.

The first horizontal portion of the sensing connection line VREFC is disposed in the horizontal direction based on the sensing line VREF so that it extends from the end of the first vertical portion to the first and fourth subpixels SPn1 and SPn4. The first horizontal portion of the sensing connection line VREFC has an area overlapping the 1$b$ scan line GL1$b$ and first to fourth data lines DL1 to DL4 present in the lower portion of the circuit area DRA.

The second vertical portions of the sensing connection line VREFC are disposed in the vertical direction so that they extend from a left end and a right end of the first horizontal portion to the second contact holes CH2, respectively. The second vertical portions of the sensing connection line VREFC are respectively connected to the first subpixel SPn1 and the fourth subpixel SPn4 through the second contact holes CH2.

The first embodiment of the disclosure forms the sensing connection line VREFC using the first electrode layer present in the upper side of the first substrate 150$a$. The first electrode layer may be formed of indium tin oxide (ITO) or ITO/Ag. The first electrode layer is positioned on the upper side as compared to a light shielding layer and is also formed on a relatively thick insulating layer. Therefore, an overlap between the sensing connection line VREFC and other electrodes or other lines, for example, the source drain metal layer does not need to be considered. This is described below based on a contact structure of the sensing line VREF and the sensing connection line VREFC with reference to FIG. 8.

Figure 8:
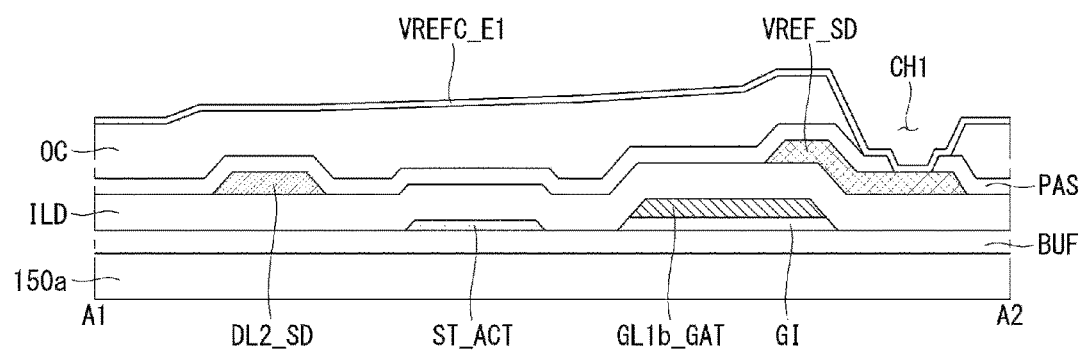
FIG. 8 is a cross-sectional view of a portion A1-A2 of FIG. 7 according to an embodiment of the disclosure.

As shown in FIGS. 7 and 8, a buffer layer BUF is formed on the first substrate 150$a$. For example, the buffer layer BUF may have a structure in which silicon oxide (SiOx) and silicon nitride (SiNx) are alternately stacked.

A semiconductor layer ST_ACT constituting an active layer of the sensing transistor ST is formed on the buffer layer BUF. For example, the semiconductor layer ST_ACT may be formed of oxide. A first insulating layer GI is formed on the buffer layer BUF adjacent to the semiconductor layer ST_ACT. The first insulating layer GI may be a gate insulating layer and may be selected as a silicon oxide (SiOx) layer, a silicon nitride (SiNx) layer, or a multilayer thereof.

A gate metal layer GL1$b$_GAT constituting the 1$b$ scan line GL1$b$ is formed on the first insulating layer GI. For example, the gate metal layer GL1$b$_GAT may be formed of one of molybdenum (Mo), aluminum (Al), chromium (Cr), gold (Au), titanium (Ti), nickel (Ni), and copper (Cu), or an alloy thereof. The gate metal layer GL1$b$_GAT may have a single-layered structure or a multi-layered structure.

A second insulating layer ILD is formed on the buffer layer BUF and covers the semiconductor layer ST_ACT and the gate metal layer GL1$b$_GAT. The second insulating layer ILD may be an interlayer dielectric layer and may be selected as a silicon oxide (SiOx) layer, a silicon nitride (SiNx) layer, or a multilayer thereof.

A first source drain metal layer VREF_SD constituting the sensing line VREF and a second source drain metal layer DL2_SD constituting the second data line DL2 are formed on the second insulating layer ILD. The first source drain metal layer VREF_SD and the second source drain metal layer DL2_SD are spaced apart from each other.

A third insulating layer PAS is formed on the second insulating layer ILD and covers the first source drain metal layer VREF_SD and the second source drain metal layer DL2_SD. The third insulating layer PAS may be a passivation layer and may be selected as a silicon oxide (SiOx) layer, a silicon nitride (SiNx) layer, or a multilayer thereof.

A fourth insulating layer OC is formed on the third insulating layer PAS. The fourth insulating layer OC may be a planarization layer and may be formed of an organic material such as polyacrylate. Other materials may be used. The first contact hole CH1 is formed in the third insulating layer PAS and the fourth insulating layer OC and exposes the first source drain metal layer VREF_SD constituting the sensing line VREF.

A first electrode layer VREFC_E1 constituting the sensing connection line VREFC is formed on the fourth insulating layer OC. The first electrode layer VREFC_E1 constituting the sensing connection line VREFC is electrically connected to the first source drain metal layer VREF_SD constituting the sensing line VREF through the first contact hole CH1.

As described above, the first electrode layer VREFC_E1 forming the sensing connection line VREFC is positioned on at least two insulating layers (for example, the insulating layers PAS and OC). In other words, because the first electrode layer VREFC_E1 is positioned on the relatively thick insulating layer, a risk of a short circuit that may occur in an overlap area between the sensing connection line VREFC and other electrodes or other lines in the repair process can greatly decrease even if the sensing connection line VREFC overlaps other electrodes or other lines.

Because of this, the first embodiment of the disclosure may be configured such that the first contact hole CH1 is disposed between the protrusion of the sensing line VREF and the third contact hole CH3 formed in the protrusion. Further, the first embodiment of the disclosure may be configured such that the sensing connection line VREFC partially overlaps the 1b scan line GL1b.

The first contact hole CH1 connecting the sensing line VREF to the sensing connection line VREFC may be disposed in a horizontal area similar to or the same as not only the second contact hole CH2 connecting the first and fourth subpixels SPn1 and SPn4 to the sensing connection line VREFC but also the protrusion of the sensing line VREF and the third contact hole CH3. As described above, when the first to third contact holes CH1 to CH3 are disposed on the same line on the plane, the first embodiment of the disclosure can solve the problem of a reduction in an aperture ratio of the subpixels resulting from the formation of jumping electrodes.

In the first embodiment of the disclosure, because the scan lines GL1a and GL1b, the sensing line VREF, and the sensing connection line VREFC are respectively formed based on the gate metal layer, the source drain metal layer, and the first electrode layer, only a short circuit related to the two kinds of lines (formed of the gate metal layer and the source drain metal layer) needs to be considered. Thus, the first embodiment of the disclosure can secure the aperture ratio of the subpixels even considering the repair process.

The first embodiment of the disclosure described that the sensing connection line VREFC has the shape similar to alphabet "E" rotated 90 degrees clockwise by way of example. However, embodiments are not limited thereto. Modification examples of the first embodiment are described below.

As shown in FIG. 9, according to a first modification example of the first embodiment, a sensing connection line VREFC includes one first vertical portion and one first horizontal portion and has a shape similar to alphabet "T". The first vertical portion of the sensing connection line VREFC is connected to the first contact hole CH1 and is disposed in the vertical direction so that an end of the first vertical portion protrudes from the first contact hole CH1 and the first horizontal portion of the sensing connection line VREFC. The first vertical portion of the sensing connection line VREFC is electrically connected to the sensing line VREF through the first contact hole CH1, and at the same time has an area overlapping the sensing line VREF.

The first horizontal portion of the sensing connection line VREFC is disposed in the horizontal direction based on the sensing line VREF so that it extends from the end of the first vertical portion to the second contact holes CH2 of the first and fourth subpixels SPn1 and SPn4. The first horizontal portion of the sensing connection line VREFC has an area overlapping the first to fourth data lines DL1 to DL4 present in the lower portion of the circuit area DRA and is spaced apart from the 1b scan line GL1b.

As shown in FIG. 10, according to a second modification example of the first embodiment, a sensing connection line VREFC includes one first horizontal portion and two second horizontal portions and has a stepped shape. The first horizontal portion of the sensing connection line VREFC is connected to the first contact hole CH1 and is disposed in the horizontal direction so that both ends of the first vertical portion pass over the upper parts of the third contact holes CH3. The first horizontal portion of the sensing connection line VREFC is electrically connected to the sensing line VREF through the first contact hole CH1, and at the same time has an area overlapping the third contact hole CH3.

The second horizontal portions of the sensing connection line VREFC are disposed in the horizontal direction based on the sensing line VREF so that they extend from both ends of the first horizontal portion to the second contact holes CH2 of the first and fourth subpixels SPn1 and SPn4 with a height difference of the stepped shape in the vertical direction. The second horizontal portions of the sensing connection line VREFC each have an area overlapping the first to fourth data lines DL1 to DL4 present in the lower portion of the circuit area DRA and are spaced apart from the 1b scan line GL1b.

As shown in FIG. 11, according to a third modification example of the first embodiment, a sensing connection line VREFC includes one first horizontal portion and has a shape similar to number "1" rotated 90 degrees (or a shape similar to alphabet "I" rotated 90 degrees). The first horizontal portion of the sensing connection line VREFC is connected to the first contact hole CH1. Further, the first horizontal portion is disposed in the horizontal direction based on the sensing line VREF so that that both ends of the first horizontal portion pass over the upper parts of the third contact holes CH3 and are extended to the second contact holes CH2 of the first and fourth subpixels SPn1 and SPn4.

The first horizontal portion of the sensing connection line VREFC is electrically connected to the sensing line VREF through the first contact hole CH1, and at the same time has an area overlapping the third contact hole CH3. Further, the first horizontal portion of the sensing connection line VREFC has an area overlapping the first to fourth data lines DL1 to DL4 present in the lower portion of the circuit area DRA and is spaced apart from the 1b scan line GL1b.

Second Embodiment

Figure 12:
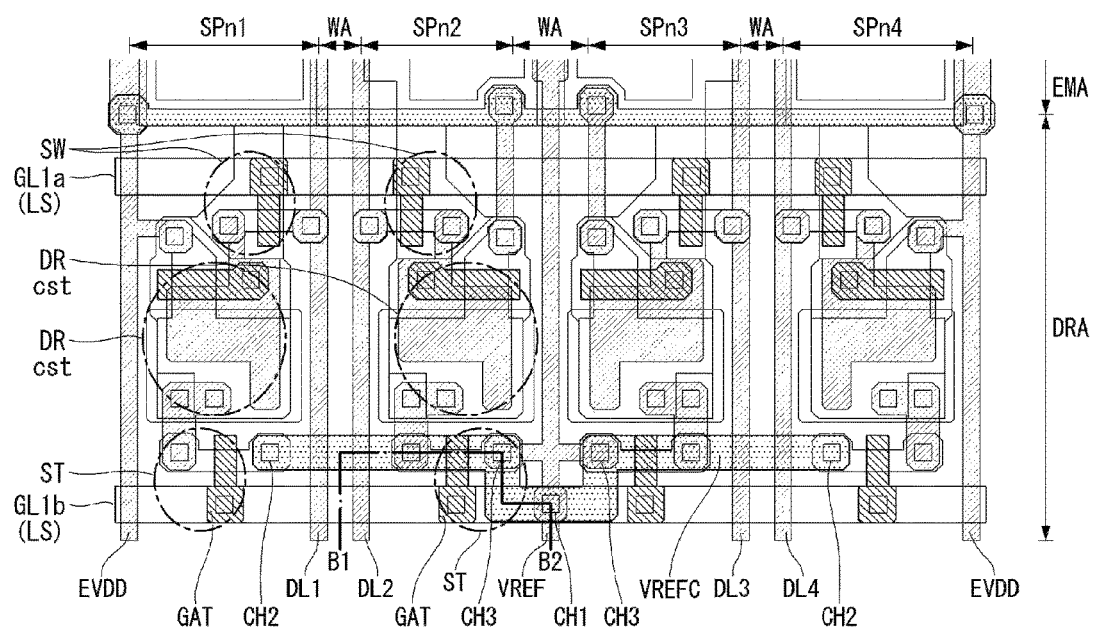
FIG. 12 illustrates in detail a circuit area of FIG. 5 in accordance with a second embodiment of the disclosure.
Figure 13:
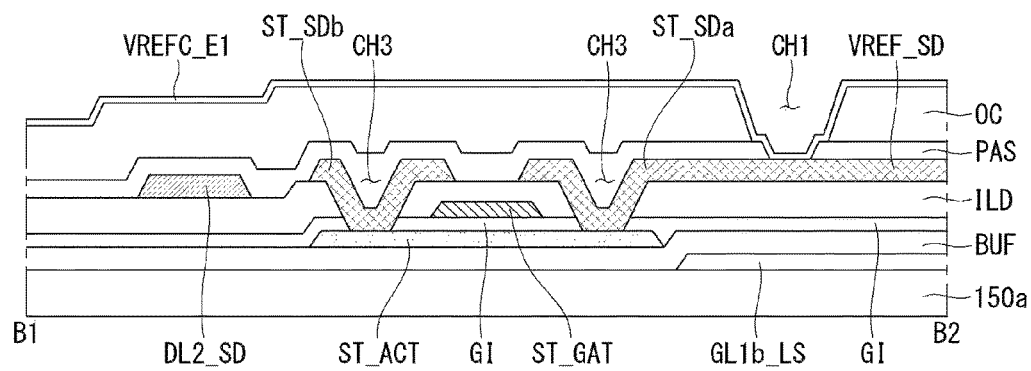
FIG. 13 is a cross-sectional view of a portion B1-B2 of FIG. 12 according to an embodiment of the disclosure.

FIG. 12 illustrates in detail a circuit area of FIG. 5 in accordance with a second embodiment of the disclosure. FIG. 13 is a cross-sectional view of a portion B1-B2 of FIG.

Figure 14:
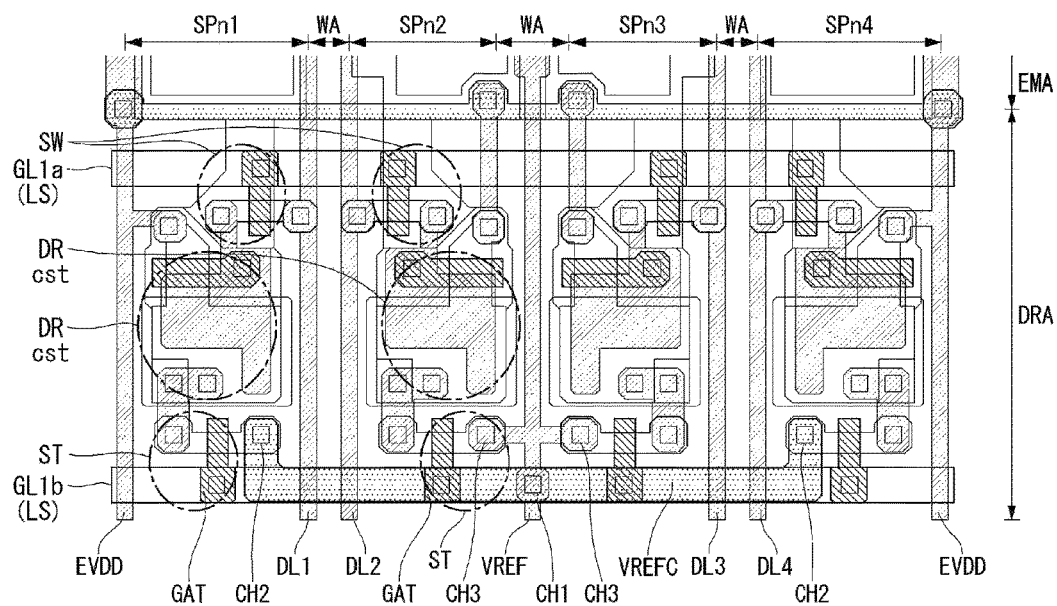
FIGS. 14 to 16 illustrate modification examples of the second embodiment of the disclosure.
Figure 15:
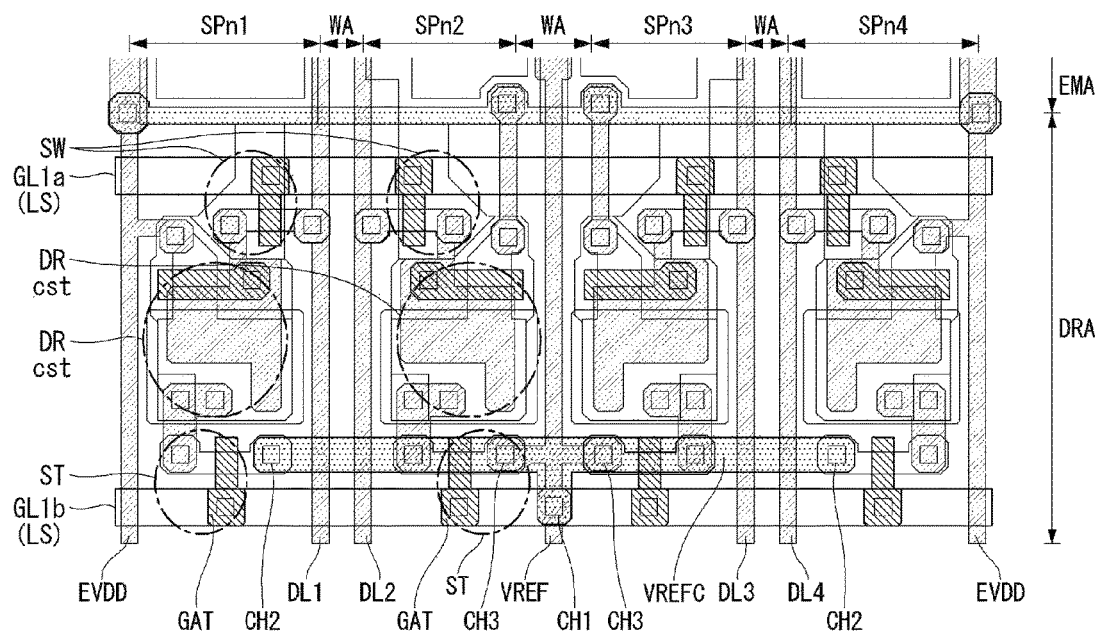
Figure 16:
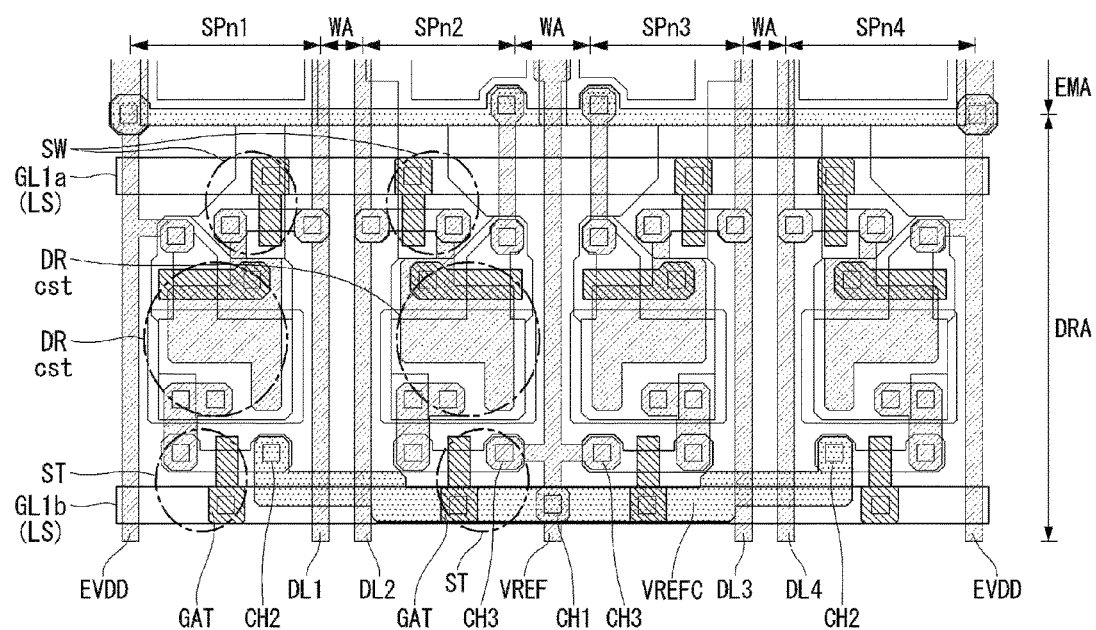

12. FIGS. 14 to 16 illustrate modification examples of the second embodiment of the disclosure.

As shown in FIG. 12, a 1a scan line GL1a and a switching transistor SW are disposed in an upper portion of a circuit area DRA. The upper portion of the circuit area DRA is a portion adjacent to a first power connection line EVDDC connected to a first power line EVDD. The first power line EVDD is disposed in a first direction (for example, a vertical direction), and the first power connection line EVDCC is disposed in a second direction (for example, a horizontal direction) that is transverse to the first direction. A 1b scan line GL1b and a sensing transistor ST are disposed in a lower portion of the circuit area DRA. The lower portion of the circuit area DRA is a portion adjacent to a sensing connection line VREFC connected to a sensing line VREF. The sensing line VREF is disposed in the first direction, and the sensing connection line VREFC is disposed in the second direction. A driving transistor DR and a capacitor Cst are disposed in a middle portion of the circuit area DRA, which is between the upper portion and the lower portion. The middle portion of the circuit area DRA is a portion between the switching transistor SW and the sensing transistor ST.

At least one or all of the 1a scan line GL1a and the 1b scan line GL1b is/are formed of a metal layer LS (for example, a light shielding layer) present in a lowermost layer of a first substrate 150a (see FIG. 13). The 1a scan line GL1a and the 1b scan line GL1b are respectively disposed in the upper portion and the lower portion of the circuit area DRA and are spaced apart from each other based on the driving transistor DR and the capacitor Cst positioned in the middle portion of the circuit area DRA. The 1a scan line GL1a and the 1b scan line GL1b are respectively connected to a gate electrode of the switching transistor SW and a gate electrode of the sensing transistor ST through contact holes.

The second embodiment of the disclosure can distribute three or more kinds of signal lines or electrodes by forming the 1a scan line GL1a and the 1b scan line GL using the light shielding layer present in the lowermost layer of the first substrate 150a. As a result, the second embodiment of the disclosure can solve a space limitation problem (i.e., efficiently arrange the elements and the signal lines) as compared to the first embodiment and increase or secure an aperture ratio of subpixels. Further, the second embodiment of the disclosure can remove a branch portion used to solve an increase problem of a line load by forming the 1a scan line GL1a and the 1b scan line GL1b using the light shielding layer present in the lowermost layer of the first substrate 150a. In the second embodiment of the disclosure, the 1a scan line GL1a may be made of the metal layer LS and the 1b scan line GL1b may be made of a gate metal layer, and vice versa.

The sensing line VREF is disposed between a second subpixel SPn2 and a third subpixel SPn3. The sensing line VREF is disposed in the first direction (or a long axis direction of the subpixels). The sensing line VREF is formed of a source drain metal layer constituting source and drain electrodes of transistors SW, DR, and ST. An arrangement of the switching transistor SW, the driving transistors DR, the sensing transistors ST, and the capacitor Cst is not limited to FIG. 12.

The sensing connection line VREFC is disposed in the circuit area DRA and is connected to the sensing line VREF through a first contact hole CH1. The sensing connection line VREFC is disposed in the second direction (or a short axis direction of the subpixels). The sensing connection line VREFC is formed of a first electrode layer present in an upper side of the first substrate 150a. The first electrode layer is used to form a first electrode (or referred to as "anode electrode") of an organic light emitting diode.

Because the second subpixel SPn2 and the third subpixel SPn3 are adjacent to the sensing line VREF, they are directly connected to the sensing line VREF through third contact holes CH3. The second subpixel SPn2 and the third subpixel SPn3 are electrically connected to the sensing line VREF through the third contact holes CH3 formed in left and right protrusions of the sensing line VREF. On the other hand, because a first subpixel SPn1 and a fourth subpixel SPn4 are spaced apart from the sensing line VREF, they are connected to the sensing line VREF through second contact holes CH2 and the sensing connection line VREFC.

The sensing connection line VREFC includes one first horizontal portion, two first vertical portions, and two second horizontal portions and has a stepped shape. The first horizontal portion of the sensing connection line VREFC is connected to the first contact hole CH1 and is disposed in the horizontal direction so that both ends of the first horizontal portion protrude to locations corresponding to the third contact holes CH3. The first horizontal portion of the sensing connection line VREFC is electrically connected to the sensing line VREF through the first contact hole CH1, and at the same time has an area overlapping the 1b scan line GL1b.

The first vertical portions of the sensing connection line VREFC are disposed in the vertical direction so that they extend from both ends of the first horizontal portion to the third contact holes CH3. The first vertical portions of the sensing connection line VREFC each have an area overlapping the third contact hole CH3 present in the lower portion of the circuit area DRA.

The second horizontal portions of the sensing connection line VREFC are disposed in the horizontal direction so that they extend from a left end and a right end of the first horizontal portion to the second contact holes CH2. The second horizontal portions of the sensing connection line VREFC are respectively connected to the first subpixel SPn1 and the fourth subpixel SPn4 through the second contact holes CH2.

The second embodiment of the disclosure forms the sensing connection line VREFC using the first electrode layer present in the upper side of the first substrate 150a. The first electrode layer may be formed of indium tin oxide (ITO) or ITO/Ag. The first electrode layer is positioned on the upper side as compared to the light shielding layer and is also formed on a relatively thick insulating layer. Therefore, an overlap between the sensing connection line VREFC and other electrodes or other lines, for example, the source drain metal layer does not need to be considered. This is described below based on a contact structure of the sensing line VREF and the sensing connection line VREFC with reference to FIG. 13.

As shown in FIGS. 12 and 13, a light shielding layer GL1b_LS constituting the 1b scan line GL1b is formed on the first substrate 150a. The light shielding layer GL1b_LS may be selected as a multilayer (Mo/Ti/Cu) having a stack structure of molybdenum (Mo), titanium (Ti), and copper (Cu). A buffer layer BUF is formed on the first substrate 150a and covers the light shielding layer GL1b_LS. For example, the buffer layer BUF may have a structure in which silicon oxide (SiOx) and silicon nitride (SiNx) are alternately stacked.

A semiconductor layer ST_ACT constituting an active layer of the sensing transistor ST is formed on the buffer layer BUF. For example, the semiconductor layer ST_ACT may be formed of oxide. A first insulating layer GI is formed on the buffer layer BUF. The first insulating layer GI may be a gate insulating layer and may be selected as a silicon oxide (SiOx) layer, a silicon nitride (SiNx) layer, or a multilayer thereof.

A gate metal layer ST_GAT constituting the gate electrode of the sensing transistor ST is formed on the first insulating layer GI. The gate metal layer ST_GAT is disposed to overlap the semiconductor layer ST_ACT. For example, the gate metal layer ST_GAT may be formed of one of molybdenum (Mo), aluminum (Al), chromium (Cr), gold (Au), titanium (Ti), nickel (Ni), and copper (Cu), or an alloy thereof. The gate metal layer ST_GAT may have a single-layered structure or a multi-layered structure.

A second insulating layer ILD is formed on the buffer layer BUF and covers the gate metal layer ST_GAT. The second insulating layer ILD may be an interlayer dielectric layer and may be selected as a silicon oxide (SiOx) layer, a silicon nitride (SiNx) layer, or a multilayer thereof.

A first source drain metal layer VREF_SD constituting the sensing line VREF, a second source drain metal layer DL2_SD constituting the second data line DL2, and third source drain metal layers ST_SDa and ST_SDb constituting a source electrode and a drain electrode of the sensing transistor ST are formed on the second insulating layer ILD.

The third source drain metal layers ST_SDa and ST_SDb are electrically connected to the semiconductor layer ST_ACT constituting the active layer of the sensing transistor ST through the third contact holes CH3. For example, the third source drain metal layer ST_SDa is connected to a drain region of the semiconductor layer ST_ACT constituting the active layer of the sensing transistor ST through the buffer layer BUF and the third contact hole CH3 of the second insulating layer ILD. The third source drain metal layer ST_SDb is connected to a source region of the semiconductor layer ST_ACT constituting the active layer of the sensing transistor ST through the buffer layer BUF and the third contact hole CH3 of the second insulating layer ILD.

The third source drain metal layer ST_SDa constituting the drain electrode of the sensing transistor ST is connected to the first source drain metal layer VREF_SD constituting the sensing line VREF. The third source drain metal layer ST_SDb constituting the source electrode of the sensing transistor ST is separated from and spaced apart from the third source drain metal layer ST_SDa. The second source drain metal layer DL2_SD constituting the second data line DL2 is spaced apart from the third source drain metal layer ST_SDb.

A third insulating layer PAS is formed on the second insulating layer ILD and covers the first source drain metal layer VREF_SD, the second source drain metal layer DL2_SD, and the third source drain metal layers ST_SDa and ST_SDb. The third insulating layer PAS may be a passivation layer and may be selected as a silicon oxide (SiOx) layer, a silicon nitride (SiNx) layer, or a multilayer thereof.

A fourth insulating layer OC is formed on the third insulating layer PAS. The fourth insulating layer OC may be a planarization layer and may be formed of an organic material such as polyacrylate. Other materials may be used. The first contact hole CH1 is formed in the third insulating layer PAS and the fourth insulating layer OC and exposes the first source drain metal layer VREF_SD constituting the sensing line VREF.

A first electrode layer VREFC_E1 constituting the sensing connection line VREFC is formed on the fourth insulating layer OC. The first electrode layer VREFC_E1 constituting the sensing connection line VREFC is electrically connected to the first source drain metal layer VREF_SD constituting the sensing line VREF through the first contact hole CH1.

As described above, the first electrode layer VREFC_E1 constituting the sensing connection line VREFC is positioned on at least two insulating layers (for example, the insulating layers PAS and OC). In other words, because the first electrode layer VREFC_E1 is positioned on the relatively thick insulating layer, a risk of a short circuit that may occur in an overlap area between the sensing connection line VREFC and other electrodes or other lines in the repair process can greatly decrease even if the sensing connection line VREFC overlaps other electrodes or other lines.

Because of this, the second embodiment of the disclosure may be configured such that the first contact hole CH1 is disposed to have an area overlapping the 1b scan line GL1b in the same horizontal area as the 1b scan line GL1b. Further, the second embodiment of the disclosure may be configured such that the sensing connection line VREFC partially overlaps the 1b scan line GL1b.

The first contact hole CH1 connecting the sensing line VREF to the sensing connection line VREFC may be disposed in a horizontal area similar to or the same as not only the second contact hole CH2 connecting the first and fourth subpixels SPn1 and SPn4 to the sensing connection line VREFC but also the protrusion of the sensing line VREF and the third contact hole CH3. As described above, when the first to third contact holes CH1 to CH3 are disposed on the same line on the plane, the second embodiment of the disclosure can solve the problem of a reduction in an aperture ratio of the subpixels resulting from the formation of jumping electrodes.

In the second embodiment of the disclosure, because the scan lines GL1a and GL1b, the sensing line VREF, and the sensing connection line VREFC are respectively formed based on the gate metal layer, the source drain metal layer, and the first electrode layer, only a short circuit related to the two kinds of lines (formed of the gate metal layer and the source drain metal layer) needs to be considered. Thus, the second embodiment of the disclosure can secure the aperture ratio of the subpixels even considering the repair process.

The second embodiment of the disclosure described that the sensing connection line VREFC has the stepped shape by way of example. However, embodiments are not limited thereto. Modification examples of the second embodiment are described below.

As shown in FIG. 14, according to a first modification example of the second embodiment, a sensing connection line VREFC includes one first horizontal portion and two first vertical portions and has a shape similar to alphabet "U". The first horizontal portion of the sensing connection line VREFC is connected to the first contact hole CH1 and is disposed in the horizontal direction based on the sensing line VREF so that both ends of the first horizontal portion are extended to the first and fourth subpixels SPn1 and SPn4. The first horizontal portion of the sensing connection line VREFC is electrically connected to the sensing line VREF through the first contact hole CH1, and at the same time has an area overlapping the 1b scan line GL1b. In this instance, the entire area of the first horizontal portion overlaps the 1b scan line GL1b. The first horizontal portion of the sensing connection line VREFC has an area overlapping the first to fourth data lines DL1 to DL4 present in the lower portion of the circuit area DRA.

The first vertical portions of the sensing connection line VREFC are disposed in the vertical direction so that they extend from both ends of the first horizontal portion to the second contact holes CH2 of the first and fourth subpixels SPn1 and SPn4. The second contact hole CH2 may be disposed in a horizontal area similar to or the same as the third contact hole CH3.

As shown in FIG. 15, according to a second modification example of the second embodiment, a sensing connection line VREFC includes one first vertical portion and one first horizontal portion and has a shape similar to alphabet "T". The first vertical portion of the sensing connection line VREFC is connected to the first contact hole CH1 and is disposed in the vertical direction so that an end of the first vertical portion is disposed in a horizontal area similar to or the same as the second contact hole CH2 and the third contact hole CH3. The first vertical portion of the sensing connection line VREFC is electrically connected to the sensing line VREF through the first contact hole CH1, and at the same time has an area overlapping the sensing line VREF.

The first horizontal portion of the sensing connection line VREFC is disposed in the horizontal direction based on the sensing line VREF so that it extends from the end of the first vertical portion to the second contact holes CH2 of the first and fourth subpixels SPn1 and SPn4. The first horizontal portion of the sensing connection line VREFC has an area overlapping the first to fourth data lines DL1 to DL4 present in the lower portion of the circuit area DRA and is spaced apart from the 1b scan line GL1b.

As shown in FIG. 16, according to a third modification example of the second embodiment, a sensing connection line VREFC includes one first horizontal portion, two second horizontal portions, and two first vertical portions, and has a stepped shape. The first horizontal portion of the sensing connection line VREFC is connected to the first contact hole CH1 and is disposed in the horizontal direction based on the sensing line VREF so that both ends of the first horizontal portion are extended to the second and third data lines DL2 and DL3 adjacent to the first horizontal portion. The first horizontal portion of the sensing connection line VREFC is electrically connected to the sensing line VREF through the first contact hole CH1, and at the same time has an area overlapping the 1b scan line GL1b. In this instance, the entire area of the first horizontal portion overlaps the 1b scan line GL1b.

The second horizontal portions of the sensing connection line VREFC are disposed in the horizontal direction so that they extend from both ends of the first horizontal portion to areas adjacent to the second contact holes CH2 of the first and fourth subpixels SPn1 and SPn4 with a height difference of the stepped shape in the vertical direction. The second horizontal portions of the sensing connection line VREFC each have an area overlapping the first to fourth data lines DL1 to DL4 present in the lower portion of the circuit area DRA and have an area partially overlapping the 1b scan line GL1b.

The first vertical portions of the sensing connection line VREFC are disposed in the vertical direction so that they extend from ends of the first horizontal portions to the second contact holes CH2 of the first and fourth subpixels SPn1 and SPn4. The second contact hole CH2 may be disposed in a horizontal area similar to or the same as the third contact hole CH3.

As described above, the embodiments of the present disclosure can prevent the damage or the short circuit of the lines and the electrodes resulting from the repair process in manufacturing the display panel including the sensing circuit for sensing the characteristics of the elements, and can secure the aperture ratio of the subpixel. The embodiments of the present disclosure can variously and freely arrange the connection lines in accordance with a manner of the repair process while preventing an increase in the line load, thereby increasing the freedom of design. Furthermore, the embodiments of the present disclosure can provide a structure of a display panel suitable for manufacturing high resolution and large-sized display devices.

Although the embodiments have been described with reference to a number of illustrative embodiments thereof, numerous other modifications and embodiments may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a plurality of subpixels formed on a first substrate, each subpixel having an emission area, in which an emission element is disposed to emit light, and a circuit area, in which a circuit for driving the emission element is disposed;
   a sensing line disposed between the subpixels in a first direction; and
   a sensing connection line disposed in the circuit area in a second direction, that is transverse to the first direction, and made of an electrode layer positioned above the sensing line, the sensing connection line electrically connecting the subpixels to the sensing line.

2. The display device of claim 1, wherein the sensing connection line is made of the same first electrode layer as a first electrode of the emission element positioned in the emission area.

3. The display device of claim 1, wherein the sensing line is connected to second and third subpixels that are adjacent to left and right sides of the sensing line, and
   wherein the sensing connection line is connected to the sensing line and is connected to first and fourth subpixels positioned outside the second and third subpixels.

4. The display device of claim 1, wherein the sensing line is made of a source drain metal layer constituting source and drain electrodes of transistors positioned in the circuit area, and
   wherein the sensing connection line is made of a first electrode layer constituting a first electrode of the emission element.

5. The display device of claim 4, wherein at least two insulating layers made of different materials are positioned between the source drain metal layer and the first electrode layer.

6. The display device of claim 3, further comprising:
   a first contact hole formed on the sensing line;
   a second contact hole formed in the circuit areas of the first and fourth subpixels; and
   a third contact hole formed in a protrusion of the sensing line,
   wherein the first to third contact holes are disposed on the same line on a plane.

7. The display device of claim 1, further comprising at least two scan lines positioned in the circuit area,
- wherein one or two of the at least two scan lines are made of a metal layer different from a gate metal layer constituting gate electrodes of transistors disposed in the circuit area.

8. The display device of claim 7, wherein the at least two scan lines include:
- a 1*a* scan line connected to a gate electrode of a switching transistor positioned in the circuit area; and
- a 1*b* scan line connected to a gate electrode of a sensing transistor positioned in the circuit area,
- wherein at least one of the 1*a* scan line and the 1*b* scan line is made of a light shielding layer present in a lowermost layer of the first substrate.

9. The display device of claim 8, wherein the sensing connection line has an area overlapping the 1*b* scan line.

10. The display device of claim 1, wherein the sensing connection line has at least one of a T-shape, an U-shape, an I-shape, and a stepped shape.

11. The display device of claim 1, wherein the sensing line and the sensing connection line are positioned on different layers.

12. The display device of claim 3, further comprising:
- a first contact hole formed on the sensing line;
- a second contact hole formed in the circuit areas of the first and fourth subpixels; and
- a third contact hole formed in a protrusion of the sensing line,
- wherein the first to third contact holes are disposed at different locations.

13. The display device of claim 3, further comprising:
- a first contact hole formed on the sensing line;
- a second contact hole formed in the circuit areas of the first and fourth subpixels; and
- a third contact hole formed in a protrusion of the sensing line,
- wherein the second and third contact holes are disposed at the same location, and the first contact hole is disposed at a location different from the second and third contact holes.

14. The display device of claim 3, further comprising:
- a first contact hole formed on the sensing line;
- a second contact hole formed in the circuit areas of the first and fourth subpixels; and
- a third contact hole formed in a protrusion of the sensing line,
- wherein the first and second contact holes are disposed at the same location, and the third contact hole is disposed at a location different from the first and second contact holes.

15. The display device of claim 3, further comprising:
- a first contact hole formed on the sensing line;
- a second contact hole formed in the circuit areas of the first and fourth subpixels; and
- a third contact hole formed in a protrusion of the sensing line,
- wherein the first to third contact holes are disposed in the circuit area, and the first contact hole is disposed further outside than the second and third contact holes.

* * * * *